(12) United States Patent
Lwee

(10) Patent No.: US 6,773,308 B2
(45) Date of Patent: Aug. 10, 2004

(54) CARD CONNECTOR FOR DIFFERENT SIZE CARDS

(75) Inventor: Nai-Hock Lwee, Singapore (SG)

(73) Assignee: Tai-Sol Electronics Co., Ltd., Taipei Hsien (TW)

(*) Notice: Subject to any disclaimer, the term of this patent is extended or adjusted under 35 U.S.C. 154(b) by 16 days.

(21) Appl. No.: 10/331,759

(22) Filed: Dec. 31, 2002

(65) Prior Publication Data

US 2004/0082224 A1 Apr. 29, 2004

(30) Foreign Application Priority Data

Oct. 23, 2002 (TW) ...................................... 91216936 U

(51) Int. Cl.[7] .............................................. H01R 24/00
(52) U.S. Cl. ........................ 439/630; 439/64; 439/945
(58) Field of Search ................................ 439/630, 945, 439/946, 631, 377, 325; 234/441

(56) References Cited

U.S. PATENT DOCUMENTS

| | | | | |
|---|---|---|---|---|
| 5,297,966 A | * | 3/1994 | Brennian et al. | 439/64 |
| 6,382,984 B1 | * | 5/2002 | Yu | 439/64 |
| 6,402,529 B2 | * | 6/2002 | Saito et al. | 439/74 |
| 6,511,350 B1 | * | 1/2003 | Ito et al. | 439/680 |
| 6,666,724 B1 | * | 12/2003 | Lwee | 439/630 |
| 2001/0029127 A1 | * | 10/2001 | Higuchi | 439/541.5 |
| 2004/0033722 A1 | * | 2/2004 | Liu et al. | 439/630 |

* cited by examiner

Primary Examiner—Hae Moon Hyeon
(74) Attorney, Agent, or Firm—Bacon & Thomas, PLLC

(57) ABSTRACT

A card connector is composed of a housing, a plurality of contact pins, a plurality of lead wires, and a card receiving connector. The housing includes an open base frame, which is bonded with two PC boards at top and bottom sides thereof and is provided with two receiving open chambers defined between the open base frame and the two PC boards for accommodating different cards. Each of the printed circuit (PC) boards has a circuit pattern and a plurality of slots. Each of the contact pins has an end connected to circuits of the PC boards and is partially received in the slots of the PC boards. The lead wires are symmetrically positioned at two sides of the housing and are electrically connected to the circuits of at least one of the PC boards. The card receiving connector is provided with a plurality of contact pikes, each of which has an end connecting to the circuits of one of the PC boards the other connected to the circuits of the PC board, and is fixedly mounted on the same PC board.

3 Claims, 5 Drawing Sheets

CARD CONNECTOR FOR DIFFERENT SIZE CARDS

BACKGROUND OF THE INVENTION

1. Field of the Invention

The present invention relates to card connectors, and more particularly to a card connector, which is compatible with any of a variety of commercially available memory cards.

2. Description of the Related Art

A conventional memory card connector, for example, a card connector constructed according to U.S. Pat. No. 6,402,529 is compatible with three kinds of memory cards, i.e. multimedia card (MMC), secure digital (SD), and smart media (SM). The card connector includes two accommodation portions for receiving different kinds of cards with different external shapes and different contact pads to be inserted into the card connector from one and the same card insertion slot. A plurality of copper strips are provided inside the housing of the card connector for contacting contact pads of an inserted memory card, and are extended to a rear side of the card connector for connecting external circuit means.

The aforesaid prior art design requires much installation space. Further, it is not compatible with other specifications of memory cards, such as compact flash (CF) cards.

SUMMARY OF THE INVENTION

The present invention has been accomplished under the circumstances in view. It is therefore the main object of the present invention to provide a card connector, which requires less installation space. It is another object of the present invention to provide a card connector, which is compatible with any of a variety of commercially available memory cards including MMC, SD, SM, and CF cards.

To achieve the foregoing objects of the present invention, the card connector is composed of a housing, a plurality of contact pins, a plurality of lead wires, and a card receiving connector. The housing includes an open base frame, which is bonded with two PC boards at top and bottom sides thereof and is provided with two receiving open chambers defined between the open base frame and the two PC boards for accommodating different cards. Each of the PC boards has a circuit pattern and a plurality of slots. Each of the contact pins has an end connected to circuits of the PC boards and is partially received in the slots of the PC boards. The lead wires are symmetrically positioned at two sides of the housing and are electrically connected to the circuits of the PC boards. The card receiving connector includes a transversely extending, narrow, elongated base and two longitudinal lateral arms arranged in parallel at two ends of the base. The base of the card receiving connector is provided with a plurality of contact pikes, each of which has an end connecting to the circuits of the PC board. One of the PC boards has a plurality of mounting holes, and the base and the two lateral arms have a plurality of mounting rods. The card receiving connector is fixedly mounted on the PC board by the mounting rods plugging into the mounting holes.

DETAILED DESCRIPTION OF THE INVENTION

Figure 1:
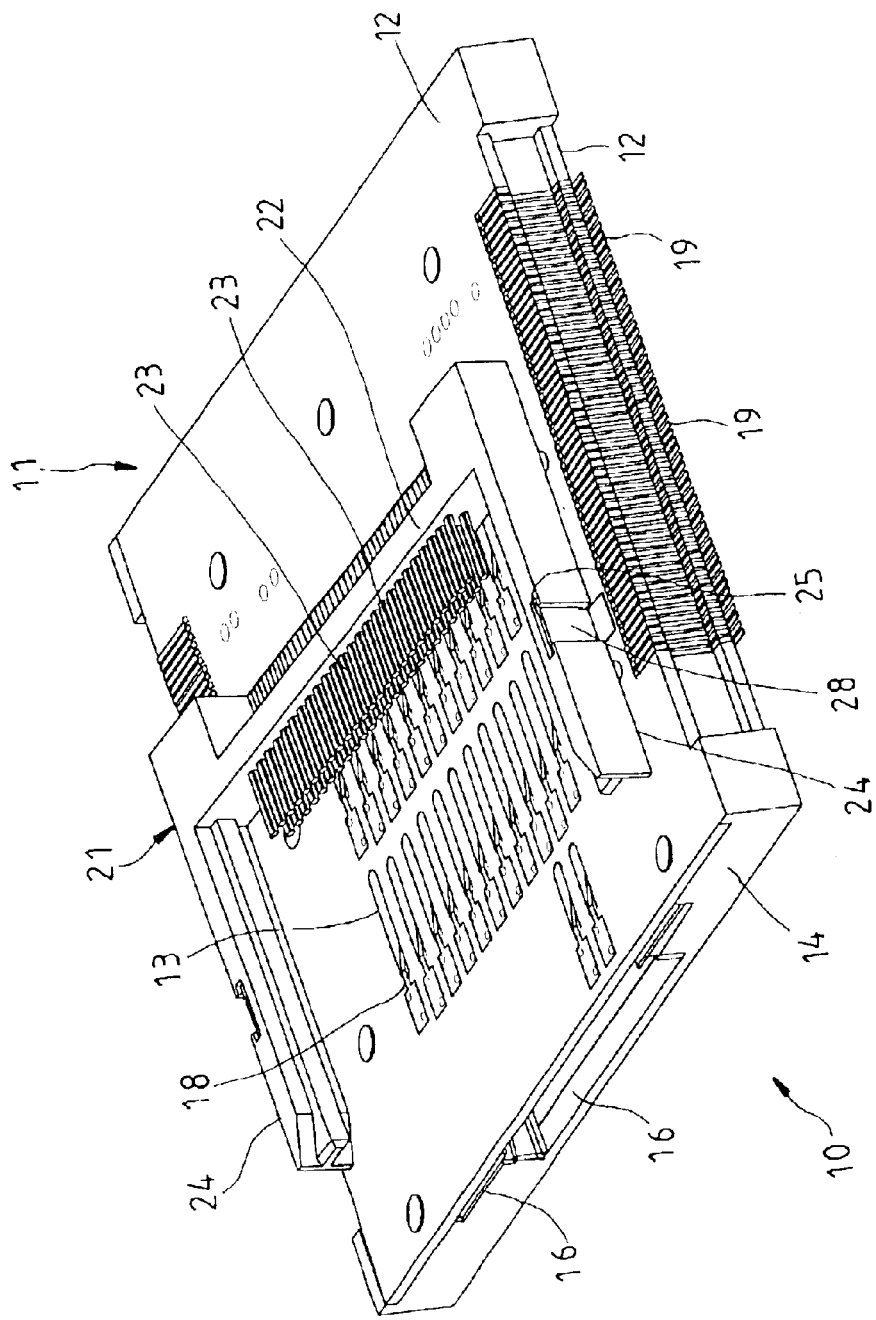
FIG. 1 is a perspective view of a first preferred embodiment of the present invention.
Figure 2:
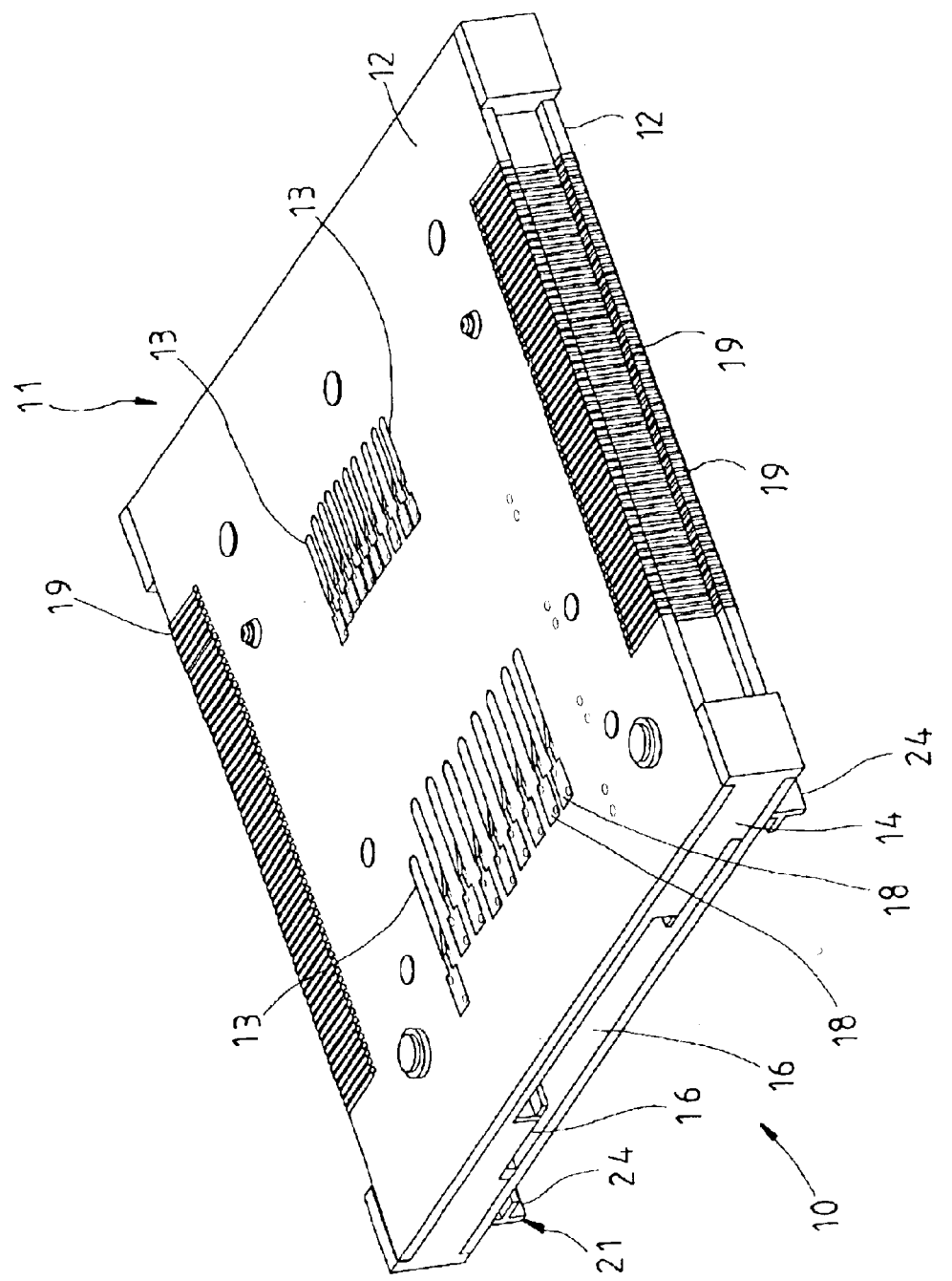
FIG. 2 is a perspective view of the first preferred embodiment of the present invention at another angle.
Figure 3:
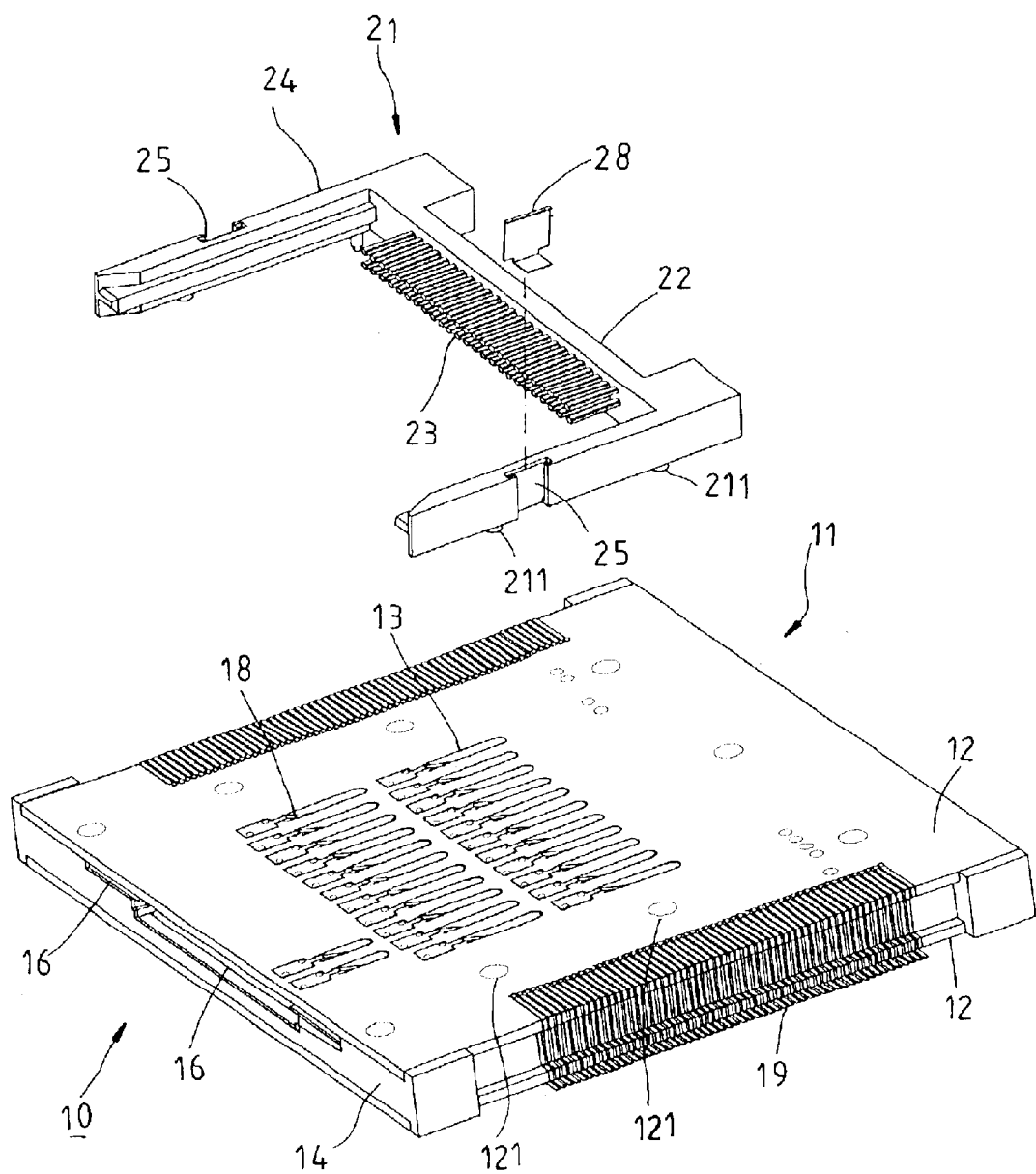
FIG. 3 is an exploded view of the first preferred embodiment of the present invention.
Figure 4:
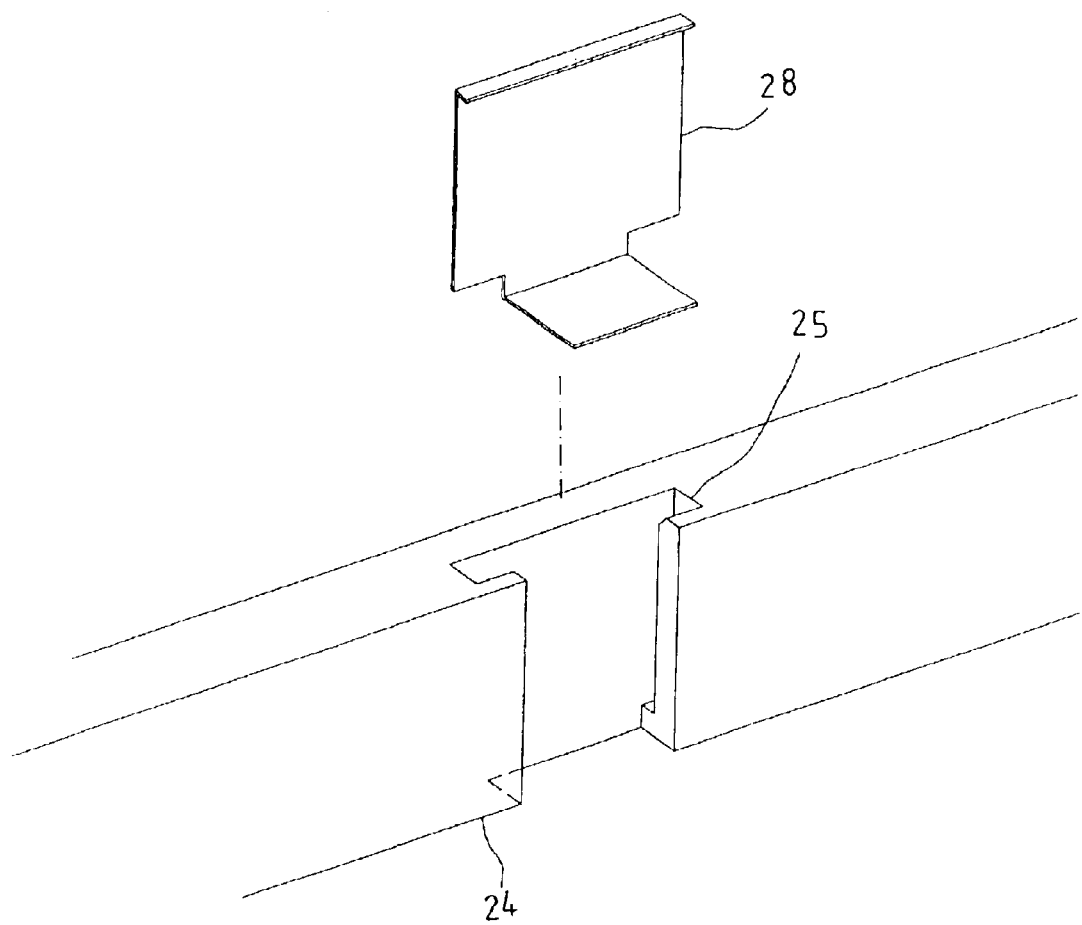
FIG. 4 is a partial enlarged exploded view of the first preferred embodiment of the present invention.

Referring to FIGS. 1–4, a card connector 10 in accordance with a first embodiment of the present invention is composed of a housing 11 and a card receiving connector 21.

The housing 11 includes an open base frame 14, two PC boards 12 bonded to top and bottom sides of the open base frame 14, two receiving open chambers 16 defined between the open base frame 14 and the two PC boards 12 for accommodating different cards (not shown). Each of the PC boards 12 has a circuit pattern (not shown), a plurality of slots 13, a plurality of contact pins 18 respectively connected to circuits of one of the PC boards 12 and partially received in the slots 13 of the PC boards 12 and contacting contact pads of an inserted card, a plurality of lead wires 19 symmetrically disposed at two sides thereof and electrically connected to the circuits of one of the PC boards 12 for electrically connecting the circuits of the PC board 12.

The card receiving connector 21 is a substantially U-shaped member having a transversely extending narrow elongated base 22 and two longitudinal lateral arms 24 arranged in parallel at two ends of the base 22. The base 22 has a plurality of contact pikes 23. A plurality of mounting rods 211 are disposed on the base 22 and the two lateral arms 24. One of the PC boards 12 has a plurality of mounting holes 121 thereon. The card receiving connector 21 is fixedly mounted on one of the PC boards 12 of the housing 11 by the mounting rods 211 plugging into the mounting holes 121. The contact pikes 23 are respectively bonded (soldered) to the circuits of the PC board 12 at an end. Additionally, the lateral arms 24 respectively have a vertical coupling groove 25 and a L-shaped metal positioning plates 28, which has a side soldered to the same PC board 12 and the other side fixedly embedded into the coupling grooves 25 of the lateral arms 24.

Figure 5:
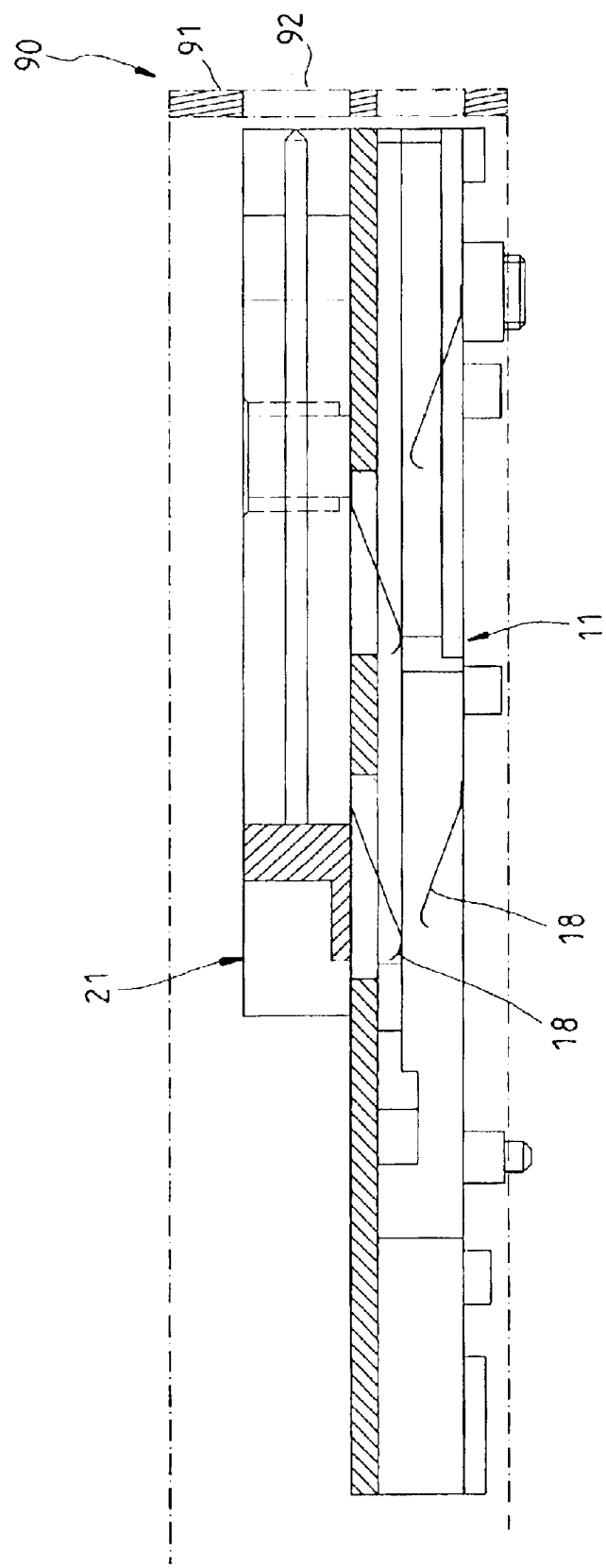
FIG. 5 is a sectional view of the first preferred embodiment of the present invention at work.

Referring to FIG. 5, the present invention is applied in a card readable apparatus embodied as a digital camera 90, which is composed of a casing 91, two insertion slots 92 positioned in the casing 91. The housing 11 and the card receiving connector 21 respectively face the insertion slots 92, thereby inserting a memory card (not shown) through one of insertion slots 92 into the housing 11 or the card receiving connector 21 and keeping the inserted memory card (not shown) in close contact with the contact pins 18 or the contact pikes 23 to be electrically connected with the contact pins 18 or the contact pikes 43 for accessing the memory card (not shown). The housing 11 is adapted to receive four kinds of cards, i.e. SD, MMC, SM, memory stick (MS). The card receiving connector 21 is adapted to fit two kinds of memory cards (CF1 and CF2). Therefore, the card connector 21 is compatible with six kinds of memory cards.

The contact pikes 23 are bonded to the circuits of the PC boards 21 of the housing 11 and the lead wires 19 are disposed on two sides of the housing 11 such that the card receiving connector 21 is electrically connected to the PC boards 12 and the card connector 10 is structurally diminished. Furthermore, the contact pins 18 are received in the slots 13 and a deformation stroke of the contact pins 18 covers the thickness of the PC boards 12, and accordingly, the housing 11 can be made relatively thinner. It is to be noted that contact pins of the prior art design are received inside the housing and a deformation stroke of the contact pins of the prior art design does not cover the thickness of the housing.

What is claimed is:

1. A card connector comprising:

a housing including an open base frame, two printed circuit (PC) boards bonded to top and bottom sides of said open base frame and two receiving open chambers defined between said open base frame and said two PC boards for accommodating different cards, said PC boards respectively having a circuit pattern and a plurality of slots, a plurality of mounting holes disposed on one of said PC boards, a plurality of contact pins respectively connected to circuits of said PC boards and partially received in said slots of said PC boards and received in said receiving open chambers for contacting contact pads of an inserted card, and a plurality of lead wires symmetrically disposed at two sides thereof and electrically connected to the circuits of said PC boards; and a card receiving connector having a base, two lateral arms arranged in parallel at two ends of said base, a plurality of contact pins extending from said base and respectively bonded to the circuits of one of said PC boards for contacting contact pads of an inserted card, and a plurality of mounting rods extending from said base and said lateral arms and respectively plugged into said mounting holes of one PC board of said housing.

2. The card connector as defined in claim 1 further comprising two L-shaped metal positioning plates respectively fastened to said housing to secure said lateral arms of said card receiving connector to one of said PC boards of said housing.

3. The card connector as defined in claim 2, wherein said card receiving connector respectively have a coupling groove at said two lateral arms, and said L-shaped metal positioning plates has a side soldered to said same PC board and the other side fixedly embedded into said coupling grooves.

* * * * *